United States Patent [19]
Akita et al.

[11] Patent Number: 6,027,621
[45] Date of Patent: Feb. 22, 2000

[54] THIN FILM FORMING APPARATUS

[75] Inventors: Noritaka Akita, Hatano; Shinichi Ogura, Kanagawa, both of Japan

[73] Assignee: Shimadzu Corporation, Kyoto, Japan

[21] Appl. No.: 09/046,611

[22] Filed: Mar. 24, 1998

[30] Foreign Application Priority Data

Apr. 25, 1997 [JP] Japan .................................. 9-121489

[51] Int. Cl.[7] ............................. C23C 14/34; C23C 14/35
[52] U.S. Cl. ................................ 204/298.06; 204/298.16; 204/298.25; 204/298.26
[58] Field of Search ........................ 204/298.16, 298.17, 204/298.18, 298.06, 298.25, 298.26

[56] References Cited

U.S. PATENT DOCUMENTS

| | | | |
|---|---|---|---|
| 4,610,770 | 9/1986 | Saito et al. | 204/192.1 |
| 4,721,553 | 1/1988 | Saito et al. | 204/192.12 |
| 4,874,497 | 10/1989 | Matsuoka et al. | 204/298 |
| 4,909,184 | 3/1990 | Fujiyama | 118/50.1 |
| 4,990,229 | 2/1991 | Campbell et al. | 204/298.06 |
| 5,022,977 | 6/1991 | Matsuoka et al. | 204/298.16 |
| 5,232,569 | 8/1993 | Nelson et al. | 204/192.12 |
| 5,487,785 | 1/1996 | Horiike et al. | 204/298.16 |
| 5,611,864 | 3/1997 | Kimura et al. | 118/723 MR |
| 5,726,412 | 3/1998 | Briffod et al. | 204/298.16 |
| 5,762,766 | 7/1998 | Kurita et al. | 204/298.26 |
| 5,891,311 | 4/1999 | Lewis et al. | 204/192.12 |

Primary Examiner—Nam Nguyen
Assistant Examiner—Steven H. Ver Steeg
Attorney, Agent, or Firm—Kanesaka & Takeuchi

[57] ABSTRACT

A thin film forming apparatus is formed of a vacuum chamber, a partition for separating the vacuum chamber, two ECR plasma generating devices provided on both sides of the vacuum chamber. A base plate is situated in the partition, and targets are disposed on both sides of the base plate in the vacuum chamber. ECR plasma is formed on both side surfaces of the base place in the vacuum chamber, and ions are caused to collide against the targets to thereby spring out atoms and to form thin films on both side surfaces of the base plate through sputtering.

10 Claims, 2 Drawing Sheets

THIN FILM FORMING APPARATUS

BACKGROUND OF THE INVENTION AND RELATED ART STATEMENT

The present invention relates to a thin film forming apparatus, more particularly, an electron cyclotron resonance (hereinafter referred to as ECR) sputtering thin film forming apparatus wherein ECR plasma is used for sputtering.

An ECR sputtering thin film forming apparatus has been used for producing a magnetic disc as a recording medium for a hard disc memory. More specifically, the ECR sputtering thin film forming apparatus is used for forming a metallic layer for constituting a magnetic layer on a surface of a base plate, such as glass. In the ECR sputtering thin film forming apparatus, a target is disposed in a vacuum chamber, and the vacuum chamber is connected to an ECR plasma generating cavity, wherein an inert gas is ionized by an ionization action of ECR plasma, the ions are caused to collide against the target to spring out atoms, and the atoms of the target material are adhered to a surface of the base plate disposed in the vacuum chamber.

However, in the conventional ECR sputtering thin film forming apparatus, only a film is formed on one side surface of the base plate. Therefore, especially, in case it is required to form films on both side surfaces of the base plate, two film forming processes have to be carried out by making a film on one side surface at a time, so that complicated mechanism and operations for turning over the base plate are required thus to result in a long processing time and poor throughput.

In view of the above defects, the present invention has been made. An object of the present invention is to provide an ECR sputtering thin film forming apparatus, wherein films are simultaneously formed on both side surfaces of a base plate to thereby improve a throughput.

SUMMARY OF THE INVENTION

In order to attain the above object, according to one aspect of the present invention, a thin film forming apparatus is formed of a vacuum chamber, two ECR plasma generating devices disposed to face each other so that the vacuum chamber is sandwiched therebetween, a magnetic field generating device for generating a predetermined magnetic field in the vacuum chamber, a gas introducing system for introducing an inert gas into the vacuum chamber, and a voltage applying device for applying negative voltages to the targets and base plate. Targets are disposed to sandwich a base plate in the chamber.

Since the two ECR plasma generating devices are disposed to face each other to sandwich the vacuum chamber therebetween and the predetermined magnetic field is formed in the vacuum chamber, plasma can be drawn into the chamber from the both sides. Since the targets are disposed to sandwich the base plate in the vacuum chamber, ions of the inert gas are caused to collide against the targets, and atoms of the target material are sprung out and simultaneously caused to adhere to both side surfaces of the base plate.

In this case, according to another aspect of the present invention, as the two ECR plasma generating devices, microwaves from different microwave sources are ejected into the vacuum chamber to face each other so that polarization or biased planes thereof cross at right angles. Thus, mutual interference of the microwaves for excitation can be effectively prevented, and the plasma from the both sides can be stably generated. Therefore, stable film forming can be carried out and, at the same time, films can be formed simultaneously on both side surfaces of the base plate, while maintaining uniform film thickness and film quality, such as hardness and tight-adhesiveness.

DETAILED DESCRIPTION OF PREFERRED EMBODIMENT

Figure 1:
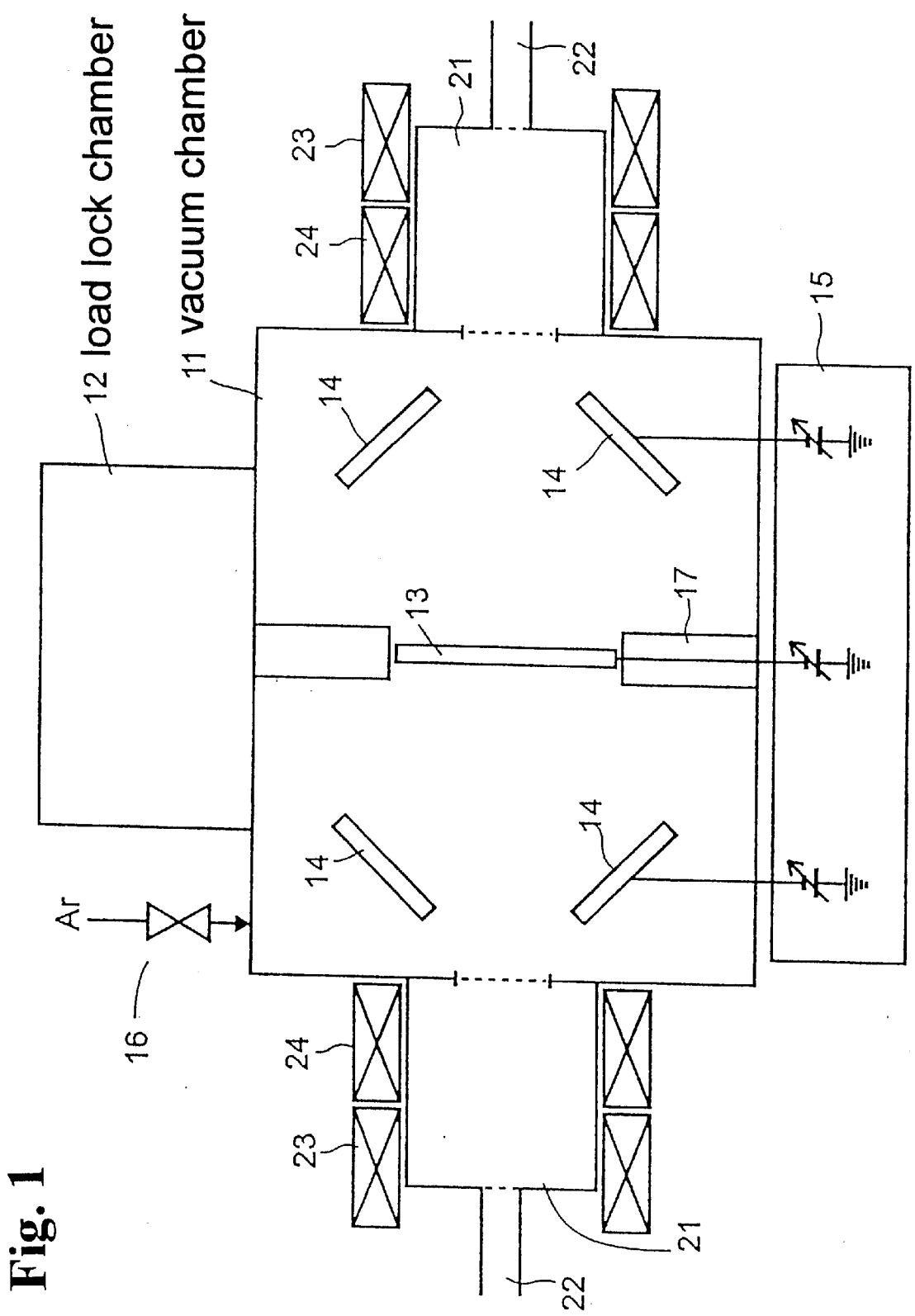
FIG. 1 is a block diagram for showing a thin film forming apparatus of one embodiment according to the present invention.

Embodiments of the present invention are described with reference to the accompanying drawings. FIG. 1 is a block diagram for showing a thin film forming apparatus of the present invention. The thin film forming apparatus is an ECR sputtering film forming apparatus, wherein thin films are simultaneously formed on both side surfaces of a base plate 13. In the present embodiment, an example for manufacturing a magnetic disc for a hard disc memory is described.

A vacuum chamber 11 is subjected to a vacuum state by an exhausting system (not shown), and the base plate 13 is disposed at a central portion of the vacuum chamber 11 so that the thin films are formed on both side surfaces thereof. Targets 14 are arranged to face one another so that the base plate 13 is sandwiched therebetween. The base plate 13 is brought into the vacuum chamber 11 through a load lock chamber 12 provided on a side surface of the vacuum chamber 11 and brought out therefrom.

High frequency voltages are applied to the base plate 13 and the targets 14 from a voltage applying device 15 to thereby generate negative self-bias voltages, or negative DC voltages are applied thereto. A gas introducing system 16 formed of a bomb, a control valve and the like is connected to the vacuum chamber 11 for introducing an argon gas therein. Cavities 21 are connected to windows on both sides, i.e. left and right sides in the drawing, of the vacuum chamber 11. More specifically, the two cavities 21 are arranged to sandwich the vacuum chamber 11 therebetween. Each cavity 21 is provided with a waveguide 22 for introducing microwaves therein, and magnetic coils 23, 24 therearound, so that ECR plasma is generated therein.

More specifically, microwave of 2.45 GHz is introduced into the cavities 21 through the waveguides 22 and simultaneously therewith, a magnetic flux density with 875 Gauss under the ECR condition is formed by the magnetic coils 23, 24, so that ECR is generated to form an active ECR plasma. The ECR plasma is drawn into the vacuum chamber 11 by a suitable magnetic field, such as a mirror magnetic field or cusp magnetic field, formed in the vacuum chamber 11 by the magnetic coils 23, 24 through windows between the cavities 21 and the vacuum chamber 11.

As described hereinabove, since the ECR plasma is formed on both sides of the vacuum chamber 11, in order to prevent mutual interference thereof, a partition 17 is provided at the center of the chamber 11.

In case a magnetic disc for a hard disc memory is manufactured, a magnetic layer is formed on the base plate 13 by sputtering. In the present embodiment, an orientation layer as a foundation is first formed, and the magnetic layer is formed thereon. As the base plate 13, a plate made of glass or aluminum is used. Targets 14 made of chrome plates and targets 14 made of Co/Cr alloy plates in conformity with materials of the orientation layer and magnetic layer are alternately disposed along peripheries of the windows between the vacuum chamber 11 and the cavities 21 to form a circle.

In the first film forming process of the orientation layers, high negative voltage is applied to only the targets 14 made of the chrome plates and at the same time low negative voltage is applied to the base plate 13. At this time, an argon gas is introduced into the vacuum chamber 11 through the gas introducing system 16. Thus, argon ions ionized through an ionization action of the ECR plasma collide against the chrome plate targets 14 to spring out chrome atoms, so that the sprung atoms adhere to the base plate 13. Through the metallic sputtering as described above, chrome orientation layers are formed on the surfaces of the base plate 13.

In the next film forming process of the magnetic layers, high negative voltage is applied to only the targets 14 made of the Co/Cr alloy plates and at the same time low negative voltage is applied to the base plate 13. At this time, the argon gas is introduced into the vacuum chamber 11, and argon ions collide against the targets 14 made of the alloy plates, so that atoms corresponding to the composition thereof are sprung out to adhere to the base plate 13. Through the metallic sputtering as described above, films of the magnetic layers can be formed on the surfaces of the base plate 13.

As described hereinabove, the ECR plasma is formed on both side surfaces of the base plate 13, and the films of the orientation layers and magnetic layers are simultaneously formed on both side surfaces of the base plate 13 through the ECR sputtering. Thus, a film forming time can be reduced and a throughput of the film forming can be improved. Further, distortion caused by separately forming the films on both side surfaces of the base plate 13 can be prevented through the simultaneous film forming on both side surfaces.

It is necessary that the ECR plasma is stably formed on both side surfaces of the base plate 13 in order to carry out a stable film forming. In the present embodiment, a partition 17 is provided in the vacuum chamber 11, so that mutual interference among the targets is prevented to thereby improve the stability.

Figure 2:
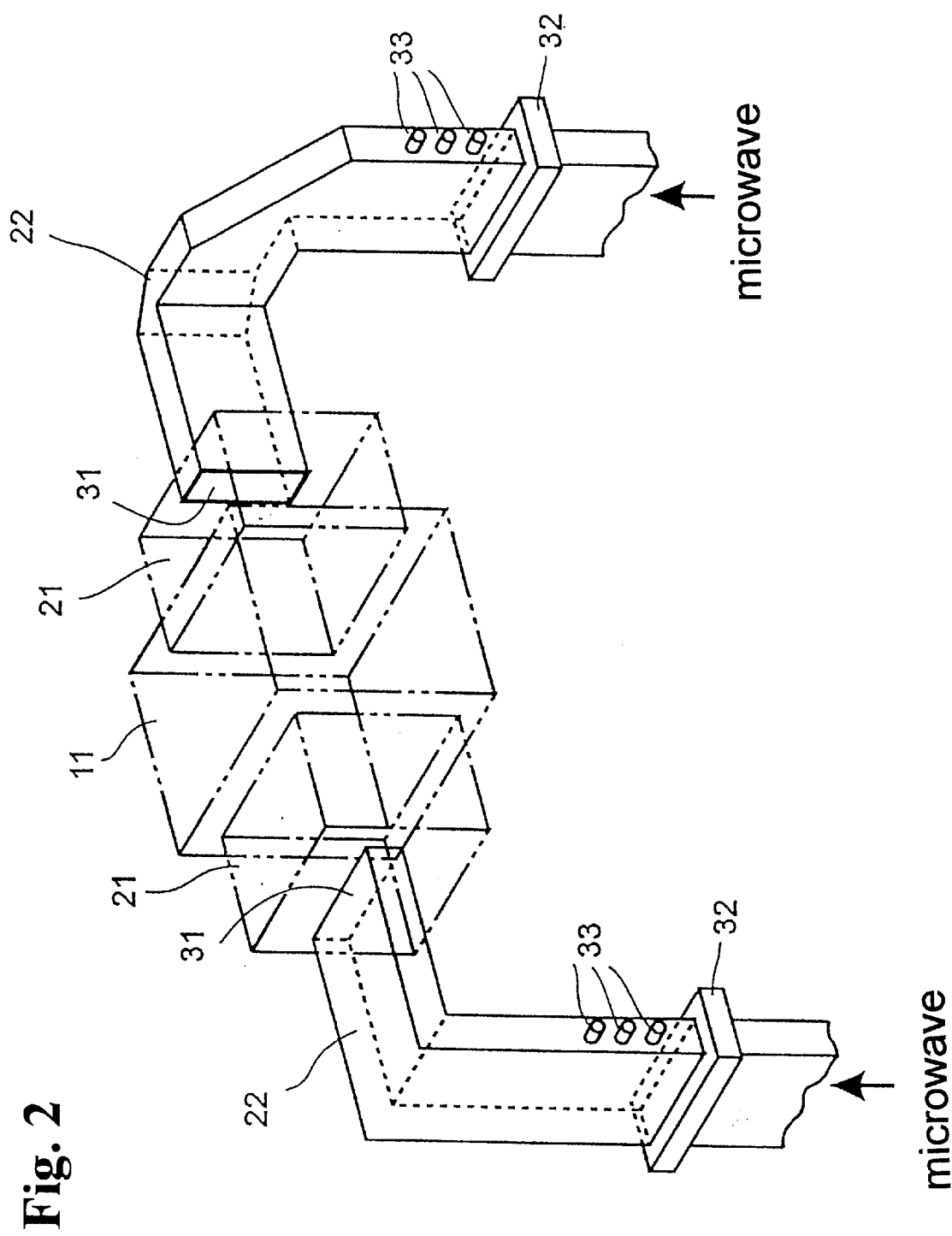
FIG. 2 is a perspective view for showing a waveguide portion of another embodiment according to the present invention.

Further, in order to increase stability of ECR plasma on both side surfaces of the base plate 13, it is also preferable that a structure as shown in FIG. 2 is employed. In FIG. 2, waveguides 22 for introducing microwaves into the two cavities 21 comprise rectangular waveguides, wherein facing openings 31 cross at right angles in the longitudinal directions thereof so that the polarization planes or biased waves' planes of the introduced microwaves cross at right angles. Then, in order to prevent reflecting waves in the waveguides 22, isolators 32 and three stub tuners 33 are provided. Further, microwave sources for sending microwaves into the two waveguides 22 are separately provided, so that frequencies and phases of the microwaves are made not to be the same to thereby prevent mutual interferences.

With the structure as described hereinabove, the microwaves are irradiated or ejected through the waveguides facing each other so that mutual interference of the microwaves is prevented to thereby stably form ECR plasma, and the stable ECR sputterings can be attained on both side surfaces of the base plate 13. In case the ECR sputtering is carried out under an unstable condition of the ECR plasma, uniformities of the film thickness and film quality, such as a hardness and a tight adhesiveness, are deteriorated. However, by stabilizing the ECR plasma, the uniformities of the film quality and thickness can be increased.

In the case of the magnetic disc, a DLC film is further formed on the magnetic layer by, for example, ECR-CVD process. The DLC film is a diamond-like thin film having a very high hardness, so that the DLC film is an optimum protective film for the magnetic disc.

Incidentally, the material for the targets 14 is not limited to the above-mentioned material. The thin film forming apparatus is not limited to production of the magnetic discs for the hard disc memory, and can be used for forming other thin films.

As described hereinabove, according to the thin film forming apparatus of the invention, the films can be formed simultaneously on both side surfaces of the base plate in a single vacuum chamber through ECR sputtering, so that a time required for forming the films can be shortened and a throughput for forming the films can be improved. Especially, in case the ECR plasma is stabilized, uniformities of the film thickness and film quality, such as film hardness and tight-adhesiveness, can be increased.

While the invention has been explained with reference to the specific embodiments of the invention, the explanation is illustrative, and the invention is limited only by the appended claims.

What is claimed is:

1. A thin film forming apparatus comprising:

a vacuum chamber having a partition with a space therein situated in a middle of the vacuum chamber, said space being adapted to receive a base plate to which thin films are to be deposited, two ECR plasma generating devices attached to the vacuum chamber, said ECR plasma generating devices including two different microwave sources to generate different microwaves and being set to face each other to sandwich the vacuum chamber and the partition therebetween, a magnetic field generating device situated adjacent to the vacuum chamber for generating a predetermined magnetic field in the vacuum chamber, a gas introducing system attached to the vacuum chamber for introducing an inert gas into the vacuum chamber, and a voltage applying device for supplying negative voltages to targets and the base plate situated in the vacuum chamber so that the thin films are simultaneously formed on both side surfaces of the base plate in the vacuum chamber by the ECR plasma generating devices.

2. A thin film forming apparatus according to claim 1, wherein said microwaves generated by the two ECR plasma generating devices are irradiated to face each other so that polarization planes cross at right angles.

3. A thin film forming apparatus according to claim 2, wherein each of the two ECR plasma generating devices includes a waveguide with an elongated rectangular cross section connected to one of the microwave sources, said elongated rectangular cross sections crossing each other at right angles at exits of the waveguides.

4. A thin film forming apparatus according to claim 3, wherein each of the two ECR plasma generating devices further includes an isolator and stub tuners to prevent reflection of ECR plasma in the waveguide.

5. A thin film forming apparatus according to claim 1, wherein said partition has means to hold the base plate therein, and means for holding the targets in the vacuum chamber.

6. A thin film forming apparatus according to claim 5, wherein said magnetic field generating device is formed around the two ECR plasma generating devices to generate magnetic field in the vacuum chamber.

7. A thin film forming apparatus according to claim 6, wherein each of the two ECR plasma generating devices includes a waveguide and a microwave source for supplying microwave to each ECR plasma generating device through the waveguide.

8. A thin film forming apparatus according to claim 1, wherein said targets are situated in the vacuum chamber to surround the base plate on each side of the base plate.

9. A thin film forming apparatus according to claim 8, wherein said targets disposed in the respective sides of the base plate include materials for forming orientation layers, and materials for forming magnetic layers to selectively deposit the materials on the base plate.

10. A thin film forming apparatus according to claim 1, wherein said two different microwave sources provide different frequencies and phases of the microwaves.

* * * * *